United States Patent
Ueda et al.

(10) Patent No.: US 10,801,548 B2
(45) Date of Patent: Oct. 13, 2020

(54) OIL FEEDER

(71) Applicant: JTEKT CORPORATION, Osaka-shi, Osaka (JP)

(72) Inventors: Yusuke Ueda, Tondabayashi (JP); Yoshimichi Higashiyama, Kashihara (JP); Tsukasa Sakazaki, Kizugawa (JP)

(73) Assignee: JTEKT CORPORATION, Osaka-shi (JP)

( * ) Notice: Subject to any disclaimer, the term of this patent is extended or adjusted under 35 U.S.C. 154(b) by 149 days.

(21) Appl. No.: 16/151,807

(22) Filed: Oct. 4, 2018

(65) Prior Publication Data

US 2019/0107153 A1  Apr. 11, 2019

(30) Foreign Application Priority Data

Oct. 11, 2017 (JP) ................ 2017-197660

(51) Int. Cl.
| | |
|---|---|
| F04B 49/06 | (2006.01) |
| F04B 43/04 | (2006.01) |
| F16C 33/66 | (2006.01) |
| F16C 19/06 | (2006.01) |
| H01L 41/04 | (2006.01) |
| H01L 41/09 | (2006.01) |
| F16C 19/16 | (2006.01) |

(52) U.S. Cl.
CPC ........ F16C 33/6659 (2013.01); F04B 43/046 (2013.01); F04B 49/06 (2013.01); F04B 49/065 (2013.01); F16C 19/06 (2013.01); H01L 41/042 (2013.01); H01L 41/0973 (2013.01); F16C 19/163 (2013.01)

(58) Field of Classification Search
CPC ...... F04B 17/003; F04B 43/046; H01L 41/09; H01L 41/0973; H01L 41/042
See application file for complete search history.

(56) References Cited

U.S. PATENT DOCUMENTS

| | | | |
|---|---|---|---|
| 6,941,785 B2 * | 9/2005 | Haynes | F04B 17/03 318/799 |
| 7,267,043 B2 * | 9/2007 | Wright | F04B 9/105 60/473 |
| 7,312,554 B2 * | 12/2007 | Vogeley | F04B 43/046 310/316.01 |

(Continued)

FOREIGN PATENT DOCUMENTS

JP  2007-533902 A  11/2007

*Primary Examiner* — Patrick Hamo
(74) *Attorney, Agent, or Firm* — Oliff PLC (57) ABSTRACT

A pump includes a piezoelectric element that deforms when a drive voltage is applied to it, and a reservoir that has a capacity to store lubricating oil and that is at least partially deformed elastically to change in the capacity when the piezoelectric element deforms. The pump discharges the lubricating oil when the reservoir decreases in the capacity. A drive circuit unit is switchable between an application state where the drive circuit unit applies the drive voltage to the piezoelectric element, and a release state where the drive circuit unit releases the drive voltage applied to the piezoelectric element. A controller controllably switches the drive circuit unit between the application state and the release state. An electric power storage unit stores electric power that is output from the piezoelectric element when the drive voltage applied to the piezoelectric element is released.

3 Claims, 6 Drawing Sheets

(56) References Cited

U.S. PATENT DOCUMENTS

| | | | |
|---|---|---|---|
| 7,498,718 B2* | 3/2009 | Vogeley | F04B 43/046 310/324 |
| 7,969,064 B2* | 6/2011 | Vogeley | H01L 41/042 310/317 |
| 8,801,668 B2* | 8/2014 | Ali | A61M 5/14212 604/151 |
| 2005/0219288 A1 | 10/2005 | Vogeley et al. | |
| 2009/0206699 A1* | 8/2009 | Osano | F04B 43/046 310/317 |

* cited by examiner

OIL FEEDER

INCORPORATION BY REFERENCE

The disclosure of Japanese Patent Application No. 2017-197660 filed on Oct. 11, 2017 including the specification, drawings and abstract, is incorporated herein by reference in its entirety.

BACKGROUND OF THE INVENTION

1. Field of the Invention

The invention relates to oil feeders, and more particularly relates to oil feeders having a pump that uses a piezoelectric element.

2. Description of the Related Art

Rotating devices, such as rolling beatings and gear mechanisms, need to be fed with lubricating oil. Japanese Patent Application Publication (Translation of PCT Application) No. 2007-533902 (JP 2007-533902 A) discloses a diaphragm pump that uses a piezoelectric element as an actuator. One approach to feeding lubricating oil to rotating devices, such as rolling bearings and gear mechanisms, may be to use an oil feeder that has such a diaphragm pump.

A piezoelectric element deforms when a voltage is applied to it, and returns to its original shape when the applied voltage is released (output). In a diaphragm pump, the deformation of a piezoelectric element is transmitted to a reservoir that stores lubricating oil. Thus, the reservoir expands or contracts, and accordingly increases or decreases in capacity. The increase in the reservoir capacity refills the reservoir with lubricating oil. The decrease in the reservoir capacity discharges the lubricating oil out of the reservoir.

In such a diaphragm pump, electric power is output from a piezoelectric element when a voltage applied to the piezoelectric element is released. The output electric power is typically converted and consumed in other forms of energy, such as heat. Effective use of the output electric power is desired.

SUMMARY OF THE INVENTION

A purpose of the invention is to provide an oil feeder that has a pump using a piezoelectric element and that enables effective use of electric power output from the piezoelectric element.

An aspect of the invention provides an oil feeder that is provided for a rotating device and that feeds lubricating oil to the rotating device. The oil feeder includes a pump, a drive circuit unit, a controller, and an electric power storage unit. The pump includes a piezoelectric element and a reservoir. The piezoelectric element deforms when a drive voltage is applied to the piezoelectric element. The reservoir has a capacity to store the lubricating oil and is at least partially deformed elastically to change in the capacity when the piezoelectric element deforms. The pump discharges the lubricating oil when the reservoir decreases in the capacity. The drive circuit unit is switchable between an application state and a release state. In the application state, the drive circuit unit applies the drive voltage to the piezoelectric element. In the release state, the drive circuit unit releases the drive voltage applied to the piezoelectric element. The controller controllably switches the drive circuit unit between the application state and the release state. The power storage unit stores electric power that is output from the piezoelectric element when the drive voltage applied to the piezoelectric element is released.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Preferred embodiments are described below with reference to the drawings. Throughout the description, like elements with like names and functions are represented by like numerals, and are not described repeatedly.

Figure 1:
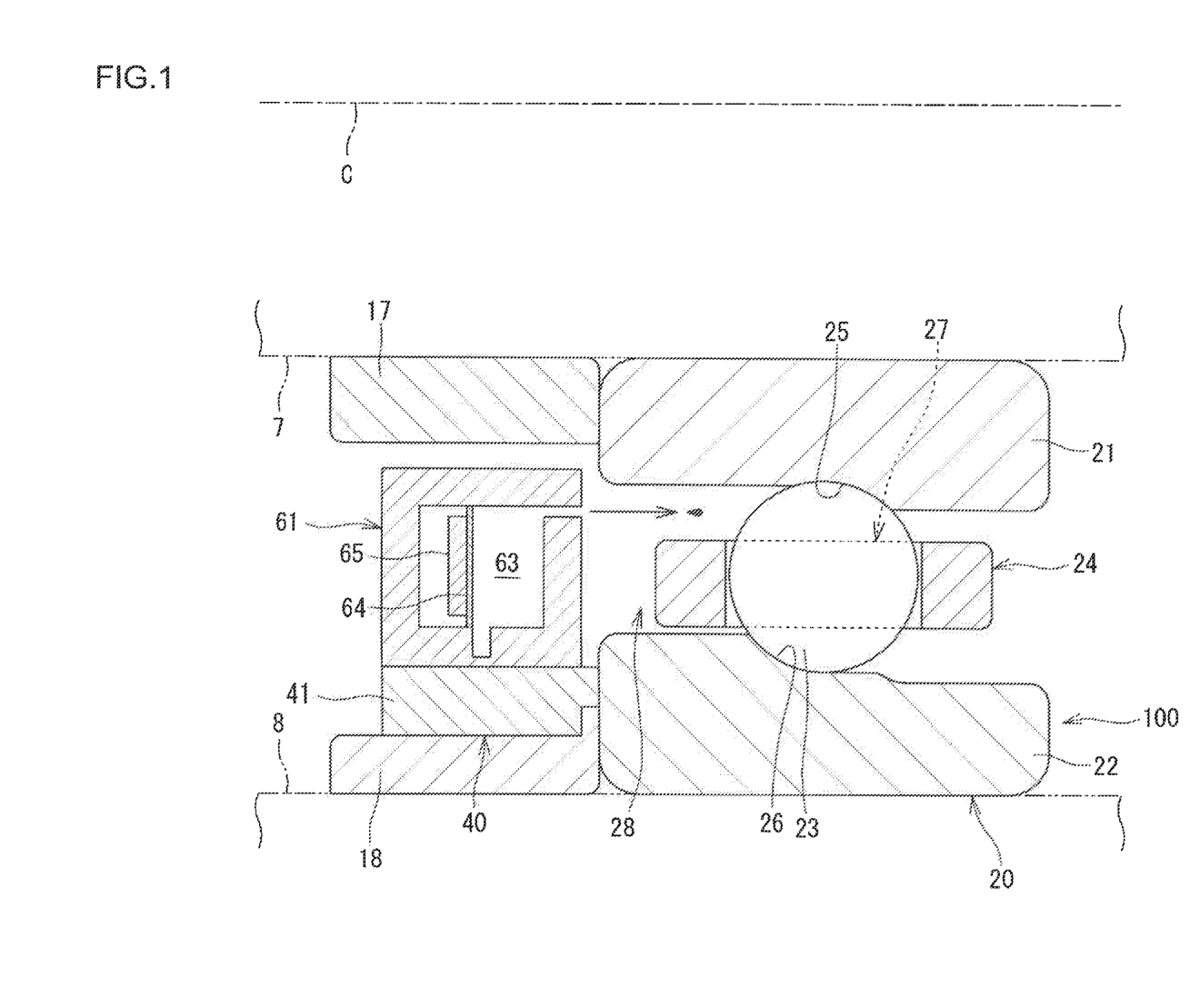
FIG. 1 is a cross-sectional view of a bearing device according to an embodiment.
Figure 2:
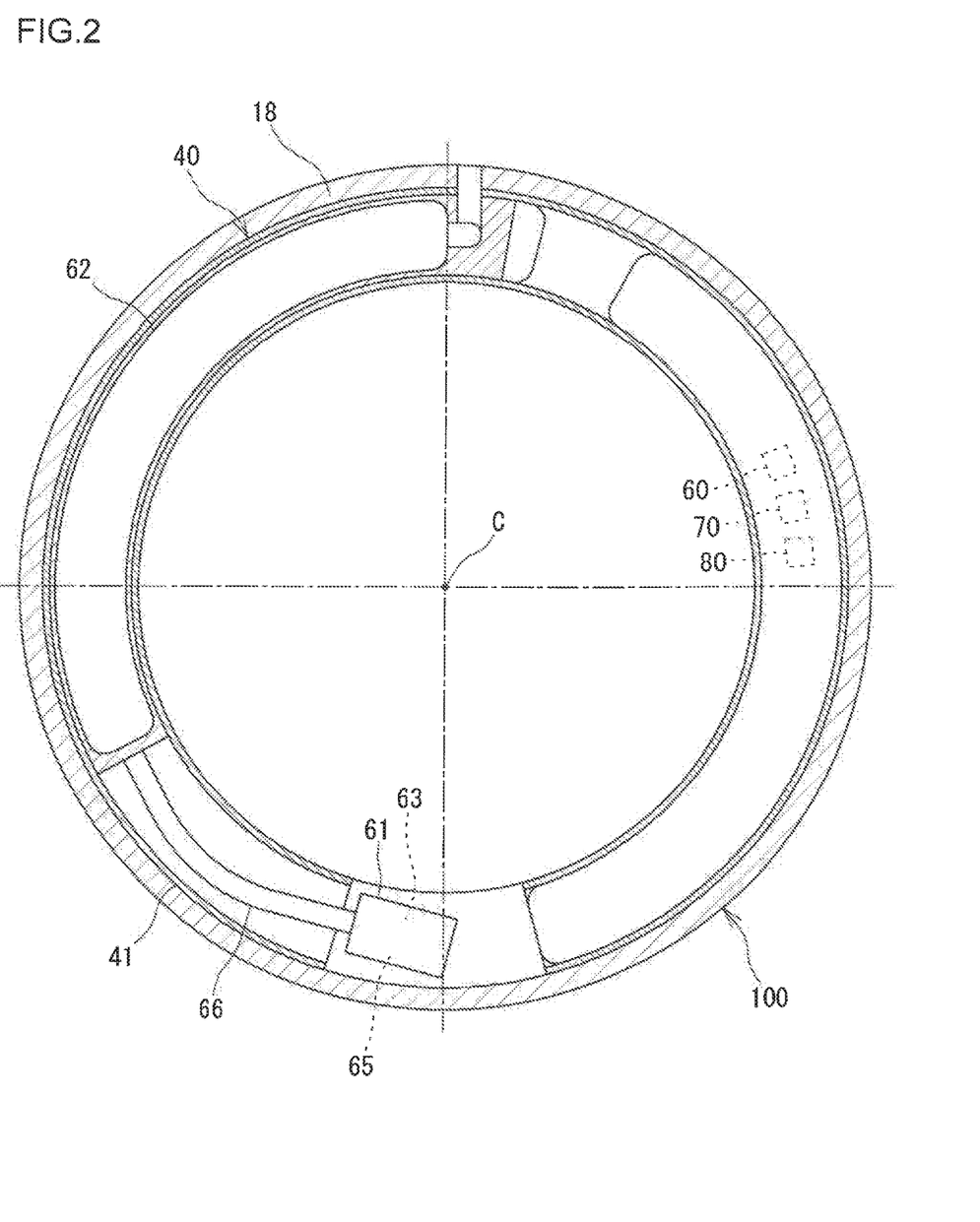
FIG. 2 is a cross-sectional view of an oil feeding unit when viewed in an axial direction.

FIG. 1 is a cross-sectional view of a bearing device (a rotating device) 100 according to the embodiment, taken along a plane including a central axis C of the bearing device 100. As illustrated in FIG. 1, the bearing device 100 includes a bearing 20 and an oil feeding unit 40 as an example of an oil feeder. The bearing device 100 further includes a cylindrical inner ring spacer 17 and a cylindrical outer ring spacer 18. FIG. 2 is a cross-sectional view of the oil feeding unit 40 when viewed in the axial direction. According to the embodiment, the bearing device 100 is mounted within a hearing housing 8 to rotatably support a main shaft 7 of a machine tool.

The oil feeding unit 40 includes a casing 41. The casing 41 is a hollow annular member with interior spaces. The interior spaces of the casing 41 accommodate a pump 61 for feeding lubricating oil, a drive circuit unit 70 for driving the pump 61, a controller 80 for controlling the drive circuit unit 70, and a power supply circuit 60. Thus, the oil feeding unit 40 is configured as an oil feeder that does not need external power supplied from outside the casing 41. One of the interior spaces serves as a tank 62 for storing lubricating oil. The tank 62 is connected to the pump 61 through a pipe 66 to allow a flow of the lubricating oil to the pump 61. As such, the oil feeding unit 40 is formed as a single unit including the casing 41, the pump 61, the tank 62, the drive circuit unit 70, the controller 80, and the power supply circuit 60.

The bearing 20 includes an inner ring 21, an outer ring 22, multiple rolling elements 23, and an annular cage 24. The cage 24 retains the rolling elements 23. The inner ring 21 is a cylindrical member and fits on the shaft 7. The inner ring 21 has an outer circumferential surface provided with a raceway groove (hereinafter referred to as an inner ring raceway groove 25). According to the embodiment, the inner ring 21 and the inner ring spacer 17 are separate members.

Alternatively, although not illustrated in the drawings, the inner ring 21 and the inner ring spacer 17 may be formed as a unitary member, inseparable from each other.

The outer ring 22 is a cylindrical member and is fixed on an inner circumferential surface of the bearing housing 8. The outer ring 22 has an inner circumferential surface provided with a raceway groove (hereinafter referred to as an outer ring raceway groove 26). According to the embodiment, the outer ring 22 and the outer ring spacer 18 are separate members. Alternatively, although not illustrated in the drawings, the outer ring 22 and the outer ring spacer 18 may be formed as a unitary member, inseparable from each other.

The inner ring 21 and the outer ring 22 are disposed concentric to each other. An annular space 28 is formed between the inner ring 21 and the outer ring 22, which are disposed concentric to each other. According to the embodiment, the inner ring 21, rotates together with the shaft 7, relative to the outer ring 22. According to the embodiment, the outer ring 22 and the outer ring spacer 18 are mounted to the bearing housing 8 and are not rotatable relative to the bearing housing 8, whereas the inner ring 21 and the inner ring spacer 17 rotate together with the shaft 7. Thus, the outer ring 22 is a stationary ring and does not rotate, whereas the inner ring 21 is a rotating ring and rotates together with the shaft 7. The outer ring spacer 18 is a stationary member, and the inner ring spacer 17 is a rotating member.

The rolling elements 23 are located in the annular space 28 and roll in the inner and outer ring raceway grooves 25 and 26. According to the embodiment, the rolling elements 23 are balls. The cage 24 is located in the annular space 28. The cage 24 is an annular member and has multiple pockets 27 that are equally circumferentially spaced from each her. Each of the rolling elements 23 is held in a different one of the pockets 27.

The power supply circuit 60 includes a power source and supplies electric power to the controller 80 and other necessary components. The following description assumes that the power source is a battery.

The oil feeding unit 40 is provided adjacent to and on one side of the annular space 28 of the bearing 20 in the axial direction. The oil feeding unit 40 feeds lubricating oil to the annular space 28.

Figure 3:
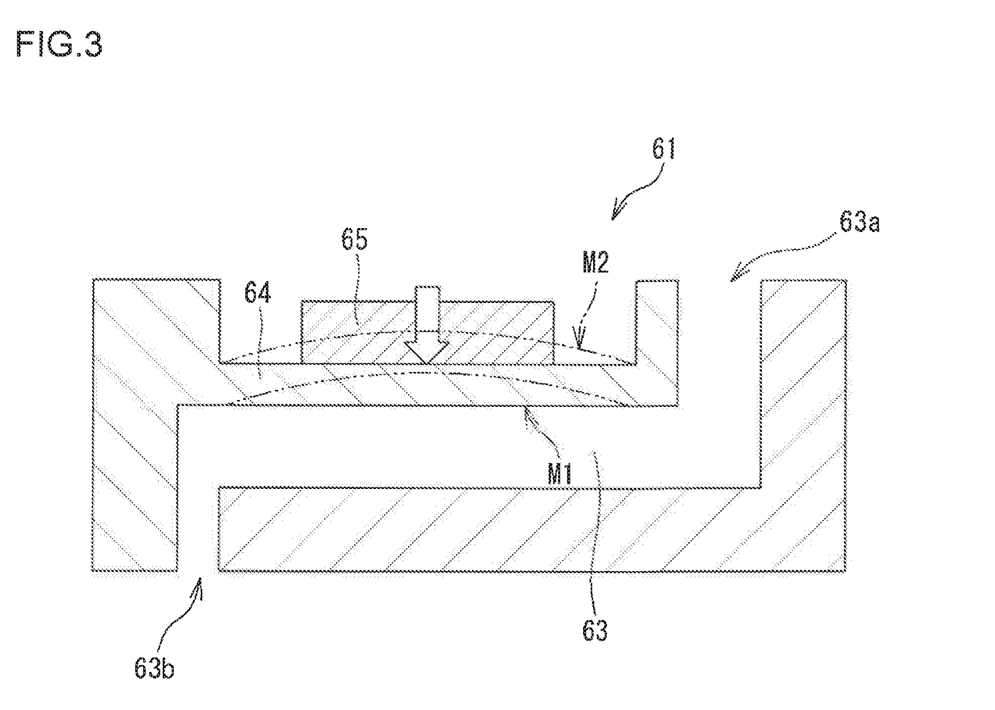
FIG. 3 is a diagram schematically illustrating the structure of a pump.

FIG. 3 is a diagram schematically illustrating the structure of the pump 61. Referring to FIGS. 2 and 3, the pump 61 is a diaphragm pump. The pump 61 includes the following: a reservoir 63 for storing lubricating oil; an elastic diaphragm (a vibration plate) 64 that defines part of walls of the reservoir 63; and a piezoelectric element (also called a pump element) 65 in contact with the diaphragm 64. The piezoelectric element 65 deforms when a voltage is applied to the piezoelectric element 65.

The reservoir 63 has an opening 63*a* facing toward the tank 62, and an opening 63*b* facing toward the annular space 28. The opening 63*a* allows lubricating oil to flow from the tank 62 to the reservoir 63. The opening 63*b* allows the lubricating oil to flow from the reservoir 63 to the annular space 28.

Figure 4:
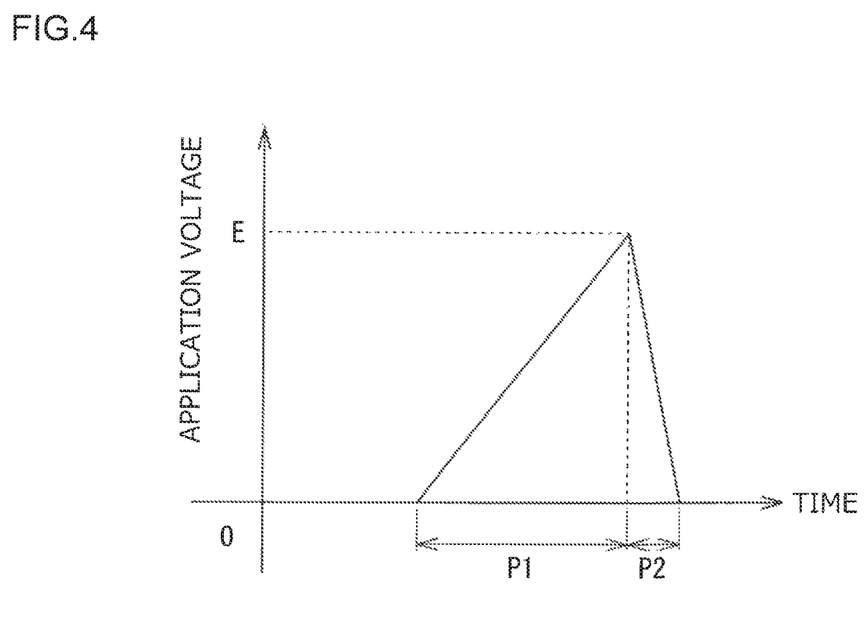
FIG. 4 is a diagram schematically illustrating an example of a change with time in voltage applied to a piezoelectric element.

The piezoelectric element 65 deforms when a voltage is applied to it. FIG. 4 is a diagram schematically illustrating an example of a change with time in voltage applied to the piezoelectric element 65. The vertical axis represents a voltage applied to the piezoelectric element 65, and the horizontal axis represents time. In the example illustrated in FIG. 4, a voltage E is applied to the piezoelectric element 65 in a first period P1, and the applied voltage E is released in a second period P2.

When the voltage E is applied to the piezoelectric element 65 in the first period P1, the piezoelectric element 65 deforms. Referring back to FIG. 3, when the piezoelectric element 65 deforms, the diaphragm 64 elastically deforms accordingly in a direction opposite to a direction denoted by an arrow, thus changing from a first state M1 to a second state M2. The first state M1 is a normal state of the diaphragm 64 where the diaphragm 64 remains in its original, undeformed shape. In the second state M2, the diaphragm 64 is curved outward in a convex manner to increase the capacity of the reservoir 63. The increase in the capacity of the reservoir 63 causes a negative pressure in the reservoir 63, so that lubricating oil in the tank 62 is sucked into the reservoir 63 through the opening 63*a*.

Then, when the applied voltage E is released in the second period P2, the piezoelectric element 65 returns from the deformed shape to its original shape. Accordingly, the diaphragm 64 returns from the second state M2 to its normal state (the first state M1) in the direction denoted by the arrow due to its elastic restoring force. When the diaphragm 64 of the piezoelectric element 65 returns to the first state M1, the reservoir 63 returns (decreases) from the increased capacity to its original capacity. The decrease in the capacity of the reservoir 63 increases the internal pressure in the reservoir 63, so that the lubricating oil stored in the reservoir 63 is discharged into the annular space 28 through the opening 63*b*.

Figure 5:
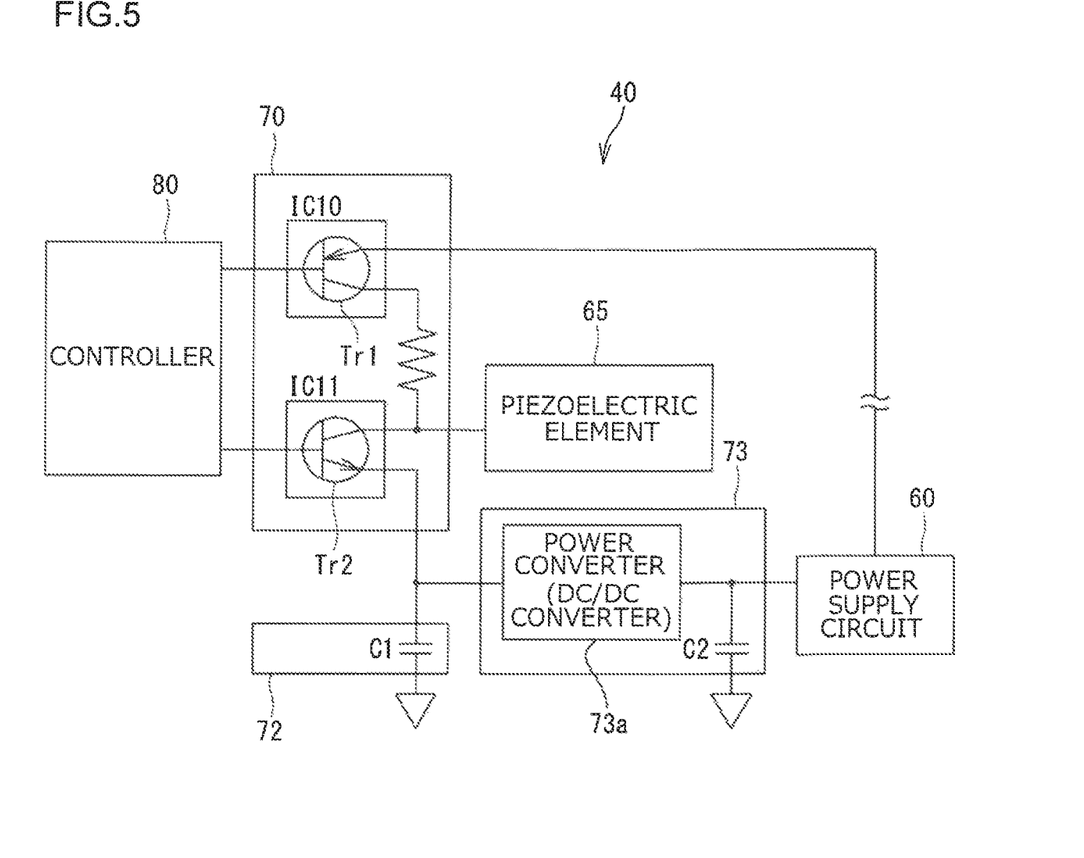
FIG. 5 is a diagram schematically illustrating an example structure of the oil feeding unit including a pump drive circuit unit.

The drive circuit unit 70 drives the pump 61 by applying a voltage to the piezoelectric element 65. FIG. 5 is a diagram schematically illustrating an example structure of the oil feeding unit 40 including the drive circuit unit 70. Referring to FIG. 5, the oil feeding unit 40 includes the following: the drive circuit unit 70 connected to the piezoelectric element 65; the controller 80; and the power supply circuit 60.

The drive circuit unit 70 is connected to the power supply circuit 60 via a booster circuit (not illustrated). Thus, a voltage of several volts from the power supply circuit 60 is boosted to several tens of volts, and the boosted voltage is supplied to the drive circuit unit 70.

The drive circuit unit 70 includes a first integrated circuit (IC) 10, a second IC 11, and a resistor (with a resistance R) connected in series between the first IC 10 and the second IC 11. The first IC 10 and the second IC 11 are switching circuits having switching elements. Examples of the switching elements include a bipolar transistor and a metal oxide semiconductor field effect transistor (MOSFET). According to the embodiment, the first IC 10 includes a transistor Tr1, and the second IC 11 includes a transistor Tr2. The transistors Tr1 and Tr2 receive a control signal from the controller 80 at their respective base terminals and are individually selectively switched between on and off states in accordance with the control signal.

The transistor Tr1 is a PNP transistor. An input terminal (an emitter) of the transistor Tr1 is connected to the power supply circuit 60 via the booster circuit (not illustrated). An output terminal (a collector) of the transistor Tr1 is connected to the piezoelectric element 65 via the resistor. The transistor Tr2 is an NPN transistor. An input terminal (a collector) of the transistor Tr2 is connected to the piezoelectric element 65. An output terminal (an emitter) of the transistor Tr2 is connected to an external circuit that is grounded.

When the transistor Tr1 (the first IC 10) is switched on, while the transistor Tr2 (the second IC 11) is switched off, the voltage E is applied to the piezoelectric element 65. That is, the state where the transistor Tr1 is on while the transistor Tr2 is off corresponds to an application state where the voltage E is applied to the piezoelectric element 65.

When the transistor Tr1 is switched off, while the transistor Tr2 is switched on, after the voltage application state, the voltage E applied to the piezoelectric element 65 is released. That is, the state where the transistor Tr1 is off while the transistor Tr2 is on corresponds to a release state where the voltage E applied to the piezoelectric element 65 is released. When the applied voltage E is released, the piezoelectric element 65 outputs electric power to the transistor Tr2.

The controller 80 is a single large scale integration (LSI) unit, being called such as a microcomputer, and includes an interface (not illustrated) for communication with the drive circuit unit 70. The controller 80 outputs the control signal to the drive circuit unit 70 via the interface. The control signal contains an instruction to individually selectively switch on and off the transistors Tr1 and Tr2.

An electric power storage unit 72 is connected to the output terminal (the emitter terminal) of the transistor Tr2. According to the embodiment, the electric power storage unit 72 is a capacitor C1 that is grounded. The electric power that is supplied to the transistor Tr2 when the applied voltage E is released from the piezoelectric element 65 is output from the transistor Tr2 to the capacitor C1. The output electric power is stored as electric energy in the capacitor C1, thus charging the capacitor C1.

Alternatively, the electric power output from the transistor Tr2 may be stored as magnetic energy, and in this case the electric power storage unit 72 may be a transformer. In terms of size reduction, using a capacitor is preferable to using a transformer.

The electric power storage unit 72 is connected to a circuit for utilizing the stored electric power. According to the embodiment, the electric power storage unit 72 is connected to an energy recovery circuit 73 as an example of such a circuit. The electric power stored in the capacitor C1 is supplied to the energy recovery circuit 73. The energy recovery circuit 73 returns the electric energy, supplied from the capacitor C1, to the power supply circuit 60.

The electric power stored in the capacitor C1 is about several tens of millivolts. The energy recovery circuit 73 includes an electric power converter (a DC/DC converter) 73a to boost the supplied electric energy to the voltage (about several volts) of the power supply circuit 60. A capacitor C2 is located between the electric power converter 73a and the power supply circuit 60. The boosted electric power is temporarily stored in the capacitor C2 and then returned to the power supply circuit 60.

The controller 80 causes the oil feeding unit 40 to perform an oil feeding operation by individually selectively switching the transistors Tr1 and Tr2 between on and off states. Specifically, the control signal output from the controller 80 to the drive circuit unit 70 includes a first control signal and a second control signal. The first control signal switches one of the transistor Tr1 and the transistor Tr2 to the on state and switches an other of the transistor Tr1 and the transistor Tr2 to the off state. In contrast, the second control signal switches the one of the transistor Tr1 and the transistor Tr2 to the off state and switches the other of the transistor Tr1 and the transistor Tr2 to the on state.

For example, according to the embodiment, the first control signal instructs to switch the transistor Tr1 to the on state and to switch the transistor Tr2 to the off state. The second control signal instructs to switch the transistor Tr1 to the off state and to switch the transistor Tr2 to the on state. Referring back to FIG. 4, the controller 80 outputs the first control signal to the drive circuit unit 70 in the first period P1, and outputs the second control signal to the drive circuit unit 70 in the second period P2.

In the drive circuit unit 70, in the first period P1, the transistor Tr1 is in the on state, and the transistor Tr2 is in the off state, in response to the first control signal. When the transistor Tr1 is in the on state, while the transistor Tr2 is in the off state, the electric power supplied from the power supply circuit 60 is supplied through the transistor Tr1 to the piezoelectric element 65 and stored in the piezoelectric element 65. As such, the voltage E is applied to the piezoelectric element 65.

When the voltage E is applied to the piezoelectric element 65, the piezoelectric element 65 deforms. The deformation of the piezoelectric element 65 causes the diaphragm 64 to elastically deform from the first state M1 to the second state M2 illustrated in FIG. 3. When the diaphragm 64 deforms to the second state M2, the reservoir 63 expands (increases in capacity).

The increase in the capacity of the reservoir 63 causes a negative pressure in the reservoir 63, so that lubricating oil in the tank 62 is sucked into the reservoir 63 through the opening 63a. Thus, the reservoir 63 is refilled with lubricating oil. The operation that refills the reservoir 63 with lubricating oil is hereinafter sometimes referred to as a refilling operation.

In the drive circuit unit 70, in the second period P2, the transistor Tr1 is switched to the off state, and the transistor Tr2 is switched to the on state, in response to the second control signal. When the transistor Tr1 is switched to the off state, and the transistor Tr2 is switched to the on state, the electric power stored in the piezoelectric element 65 in the first period P1 is output to the transistor Tr2, so that the voltage applied to the piezoelectric element 65 is released.

When the applied voltage E is released from the piezoelectric element 65, the piezoelectric element 65 returns from the deformed shape to its original shape. Accordingly, the diaphragm 64 returns from the second state M2 to its normal state (the first state M1) due to its elastic restoring force. When the diaphragm 64 returns to the first state M1, the reservoir 63 returns (decreases) from the increased capacity to its original capacity.

When the reservoir 63 returns (decreases) to its original capacity, the internal pressure in the reservoir 63 increases accordingly, so that lubricating oil stored in the reservoir 63 is discharged into the annular space 28 through the opening 63b. The flow rate of lubricating oil discharged from the reservoir 63 is very small, for example, less than flow rates in the order of picoliters. The operation that discharges lubricating oil from the reservoir 63 into the annular space 28 is hereinafter sometimes referred to as a discharging operation.

According to the embodiment, the controller 80 outputs the first control signal and the second control signal successively and alternately in this order to the drive circuit unit 70. This causes the pump 61 to successively and alternately perform the refilling operation and the discharging operation. The refilling and discharging operations of the pump 61 supply lubricating oil from the oil feeding unit 40 to the bearing 20.

Figure 6:
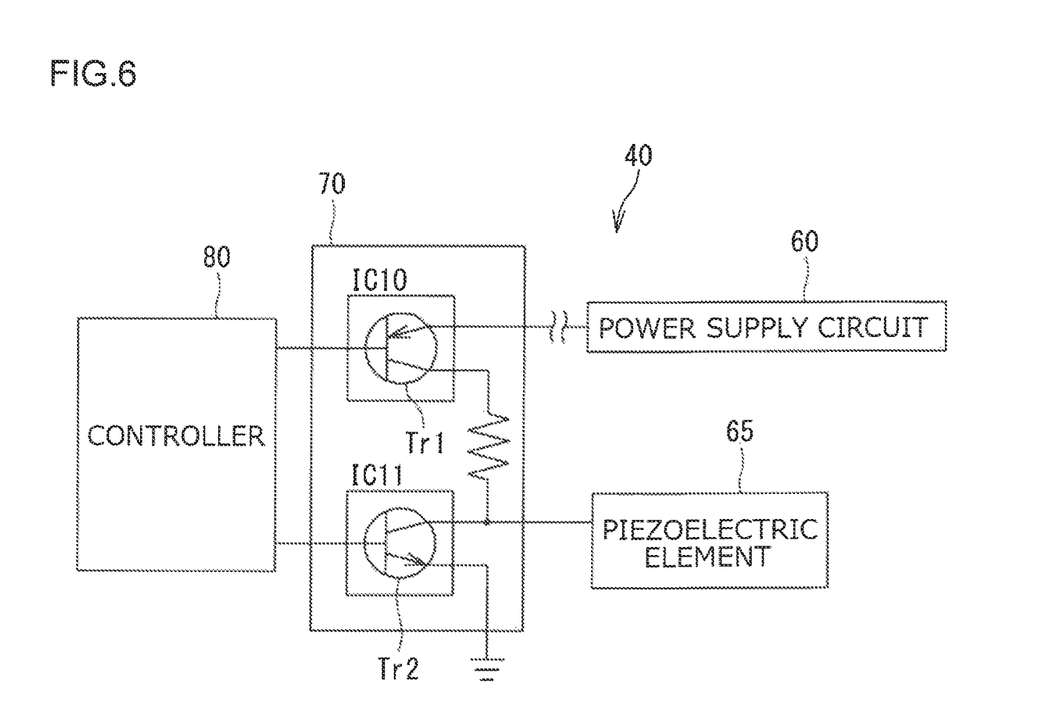
FIG. 6 is a diagram schematically illustrating the structure of a pump drive circuit unit according to a comparison example.

FIG. 6 is a schematic diagram of the circuit structure of a drive circuit unit 70 included in an oil feeder according to a comparison example, i.e., FIG. 6 illustrates an example of a common drive circuit for a diaphragm pump. As illustrated in FIG. 6, in the drive circuit unit 70 according to the comparison example, an output terminal (an emitter) of a transistor Tr2 is grounded. In the drive circuit unit 70 according to the comparison example, when a voltage applied to a piezoelectric element 65 is released, electric power is output from the piezoelectric element 65 to the transistor Tr2. The output electric power is converted and consumed in other forms of energy, such as heat.

In contrast, in the drive circuit unit 70 included in the oil feeding unit 40 according to the embodiment, the output terminal (the emitter) of the transistor Tr2 is connected to the electric power storage unit 72. The electric power output from the piezoelectric element 65 to the transistor Tr2 is output from the transistor Tr2 to the electric power storage unit 72 and stored in the electric power storage unit 72, thus charging the electric power storage unit 72.

According to the embodiment, the stored electric power is returned to the power supply circuit 60 via the energy recovery circuit 73 that is connected to the electric power storage unit 72. When the power source included in the power supply circuit 60 is a battery, the returned electric power charges the battery. As such, the electric power output from the piezoelectric element 65 is reused to drive the oil feeding unit 40 and thus is effectively used. Specifically, the output electric power is usable to power the drive circuit unit 70 and the controller 80. Although not illustrated in the drawings, the output electric power may be used to power other devices, such as a sensor for detecting the state of the bearing device 100 or a communication device for wireless communication with an external device. This makes it possible to reduce electric power necessary to drive the oil feeding unit 40. The reduction in necessary electric power enables a battery to have a smaller capacity, thus leading to a reduction in cost of an oil feeder that includes the battery.

Further, the reduction in the battery capacity enables the tank 62 to have more capacity. The increase in the capacity of the tank 62 enables the tank 62 to store more lubricating oil. This reduces the frequency of maintenance necessary to refill the tank 62 with lubricating oil, thus increasing the life of the oil feeding unit 40.

Further, when electric power from the piezoelectric element 65 and electric power from the power supply circuit 60 are sufficient in total to drive the oil feeding unit 40, it is unnecessary to supply, from an external power source, the oil feeding unit 40 with electric power that is used to drive the oil feeding unit 40. This significantly widens the range of applications of the oil feeding unit 40.

According to the embodiment, the oil feeding unit 40 is configured as an oil feeder that does not need electric power supply from outside the casing 41. Alternatively, the power supply circuit 60 and the power storage unit 72 may be located outside the casing 41 of the oil feeding unit 40 so that the oil feeding unit 40 may be supplied with electric power from outside the casing 41.

According to the embodiment, when the diaphragm 64 is elastically deformed by the deformation of the piezoelectric element 65, the reservoir 63 of the pump 61 expands and increases in capacity, thereby performing the refilling operation, and then the reservoir 63 returns to its original capacity, thereby performing the discharging operation. The capacity of the reservoir 63 may change in other ways. For example, the discharging operation may be performed when the reservoir 63 contracts and decreases in capacity, and the refilling operation may be performed when the reservoir 63 returns from the decreased capacity. In this case, the deformation of the piezoelectric element 65 elastically deforms the diaphragm 64 (to a third state) such that the diaphragm 64 is curved inward in a concave manner to decrease the capacity of the reservoir 63.

When the deformation of the piezoelectric element 65 elastically deforms the diaphragm 64 from the normal state (the first state M1) to the third state, the reservoir 63 contracts (decreases in capacity). The contraction of the reservoir 63 increases the internal pressure in the reservoir 63, so that lubricating oil stored in the reservoir 63 is discharged into the annular space 28 through the opening 63b.

When the piezoelectric element 65 returns from the deformed shape to its original shape, the diaphragm 64 returns from the third state to the first state M1 due to its elastic restoring force. Thus, the reservoir 63 returns from the contracted state (increases in capacity). The increase in the capacity of the reservoir 63 causes a negative pressure in the reservoir 63, so that lubricating oil in the tank 62 is sucked into the reservoir 63 through the opening 63a.

It is to be understood that the embodiment and modifications described above are illustrative in all respects, rather than restrictive. The scope of the invention is defined by the claims, not by the description of the embodiment and modifications, and includes all changes that fall within the scope of the claims and the equivalents thereof.

The invention enables effective use of electric power that is output from a piezoelectric element used in a pump of an oil feeder.

What is claimed is:

1. An oil feeder provided for a rotating device and configured to feed lubricating oil to the rotating device, the oil feeder comprising:
   a pump including a piezoelectric element and a reservoir, the piezoelectric element deforming when a drive voltage is applied to the piezoelectric element, the reservoir having a capacity to store the lubricating oil, the reservoir being at least partially deformed elastically to change in the capacity when the piezoelectric element deforms, the pump discharging the lubricating oil when the reservoir decreases in the capacity;
   a drive circuit unit switchable between an application state where the drive circuit unit applies the drive voltage to the piezoelectric element, and a release state where the drive circuit unit releases the drive voltage applied to the piezoelectric element;
   a controller configured to controllably switch the drive circuit unit between the application state and the release state; and
   an electric power storage unit configured to store electric power that is output from the piezoelectric element when the drive voltage applied to the piezoelectric element is released, wherein:
   the drive circuit unit includes first and second switching circuits each switchable between an on state and an off state,
   the first switching circuit in the on state applies the drive voltage to the piezoelectric element,
   the second switching circuit in the on state releases the drive voltage applied to the piezoelectric element,
   the controller switches the drive circuit unit between the application state and the release state by individually selectively switching the first and second switching circuits between the on and off states,
   the electric power storage unit is connected to an output terminal of the second switching circuit, and
   when the first switching circuit is in the off state, while the second switching circuit is in the on state, the electric power output from the piezoelectric element is output through the second switching circuit from the output terminal of the second switching circuit.

2. The oil feeder according to claim 1, comprising:
an energy recovery circuit connected to the electric power storage unit to return the electric power stored in the electric power storage unit to an electric power source that powers the drive circuit unit.
3. The oil feeder according to claim 2, wherein
the energy recovery circuit includes a converter that boosts a voltage of the electric power stored in the electric power storage unit.

* * * * *